(12) United States Patent
Park et al.

(10) Patent No.: US 11,982,707 B2
(45) Date of Patent: May 14, 2024

(54) SEMICONDUCTOR DEVICE

(71) Applicant: SAMSUNG ELECTRONICS CO., LTD., Suwon-si (KR)

(72) Inventors: Junsik Park, Suwon-si (KR); Heesu Kim, Suwon-si (KR); Bonggyu Kang, Yongin-si (KR); Youngmin Ku, Seongnam-si (KR); Namsu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/873,385

(22) Filed: Jul. 26, 2022

(65) Prior Publication Data

US 2023/0133288 A1 May 4, 2023

(30) Foreign Application Priority Data

Nov. 2, 2021 (KR) .................. 10-2021-0148922

(51) Int. Cl.
*G01R 31/28* (2006.01)
*G01R 27/26* (2006.01)
*H05K 1/18* (2006.01)

(52) U.S. Cl.
CPC ...... *G01R 31/2884* (2013.01); *G01R 27/2611* (2013.01); *G01R 31/2879* (2013.01); *H05K 1/181* (2013.01); *H05K 2201/1003* (2013.01)

(58) Field of Classification Search
CPC ............ G01R 31/2884; G01R 27/2611; G01R 31/2879; G01R 15/18; G01R 19/16571; G01R 19/16552; H05K 1/181; H05K 2201/1003; H05K 1/0298; H05K 1/165; H01L 27/0288; H01L 23/62; H01L 27/0266

See application file for complete search history.

(56) References Cited

U.S. PATENT DOCUMENTS

| | | |
|---|---|---|
| 8,345,394 B2 | 1/2013 | Zhao et al. |
| 8,536,893 B2 | 9/2013 | Worley et al. |
| 8,681,458 B2 | 3/2014 | Robb et al. |
| 9,629,294 B2 | 4/2017 | Kunz, Jr. et al. |
| 9,673,116 B2 * | 6/2017 | DeForge ................. H01L 22/34 |
| 2014/0184253 A1 | 7/2014 | Nelsen et al. |

(Continued)

*Primary Examiner* — Farhana A Hoque
(74) *Attorney, Agent, or Firm* — F. Chau & Associates, LLC

(57) ABSTRACT

A semiconductor device includes an internal circuit connected to at least one pad. A first inductor element is connected between the at least one pad and the internal circuit, a second inductor element coupled to the first inductor element and generating an induced voltage due to an overcurrent flowing in the first inductor element. An event detection circuit includes a monitoring element connected to the second inductor element. The monitoring element is configured to generate an event detection signal by sensing changes in properties of the monitoring element caused by at least one of the induced voltages generated in the second inductor element and a current flowing in the second inductor element. The internal circuit supplies an operating voltage to the event detection circuit, and determines whether an event causing the overcurrent has occurred by receiving the event detection signal from the event detection circuit.

20 Claims, 13 Drawing Sheets

(56) References Cited

U.S. PATENT DOCUMENTS

| | | |
|---|---|---|
| 2015/0280415 A1 | 10/2015 | Welty |
| 2017/0346280 A1* | 11/2017 | Stockinger ......... G01R 31/2856 |
| 2019/0089150 A1* | 3/2019 | Gharibdoust ........... H01F 29/02 |
| 2019/0271728 A1 | 9/2019 | Seitzinger et al. |
| 2020/0158771 A1 | 5/2020 | O'Donnell et al. |
| 2021/0075215 A1 | 3/2021 | Huang et al. |

\* cited by examiner

SEMICONDUCTOR DEVICE

CROSS-REFERENCE TO RELATED APPLICATION(S)

This application claims the benefit of priority from Korean Patent Application No. 10-2021-0148922 filed on Nov. 2, 2021 the Korean Intellectual Property Office, the disclosure of which is incorporated by reference in its entirety herein.

TECHNICAL FIELD

Example embodiments of the present disclosure relate to a semiconductor device.

DISCUSSION OF RELATED ART

A semiconductor device may include a plurality of pads, and the plurality of pads may connect an internal circuit of the semiconductor device to another internal or external device. An overcurrent caused by an event occurring around the semiconductor device, such as, for example, static electricity or a surge event, may surge into the semiconductor device through the plurality of pads in various circumstances, irrespective of whether the semiconductor device is operating or not, and an overcurrent may cause damage to devices included in the internal circuit of the semiconductor device.

Thus, it is desirable to effectively detect an overcurrent generated by an unintended event.

SUMMARY

An example embodiment of the present disclosure is to provide a semiconductor device which may apply an induced voltage generated by an overcurrent caused by various events to a monitoring element isolated from an internal circuit of the semiconductor device. The semiconductor device senses changes in properties of the monitoring element, effectively detecting a damage-causing event to devices.

According to an example embodiment of the present disclosure, a semiconductor device comprises an internal circuit connected to at least one pad, a first inductor element connected between the at least one pad and the internal circuit, a second inductor element inductively coupled to the first inductor element, and configured to generate an induced voltage due to an overcurrent flowing in the first inductor element; and an event detection circuit including a monitoring element connected to the second inductor element, the monitoring element is configured to generate an event detection signal by sensing the induced voltage across the second inductor element. In an embodiment, the internal circuit supplies an operating voltage to the event detection circuit, and determines whether an event causing the overcurrent has occurred by receiving the event detection signal from the event detection circuit.

According to an example embodiment of the present disclosure, a semiconductor device includes a semiconductor package including at least one internal circuit and an event detection circuit configured to detect an event generating an overcurrent flowing into the at least one internal circuit, a printed circuit board having a mounting region on which the semiconductor package is mounted, and including a plurality of wiring patterns is electrically connected to the semiconductor package and a plurality of wiring pads are connected to the plurality of wiring patterns. The semiconductor device further includes a first inductor element connected between at least one of the plurality of wiring pads and the internal circuit, and a second inductor element coupled to the first inductor element and connected to the event detection circuit, and wherein the event detection circuit includes a monitoring element of which properties change by electromagnetic induction from the second inductor element coupled to the first inductor element, and wherein the event detection circuit is further configured to detect changes in properties of the monitoring element and to output an event detection signal to the internal circuit.

According to an example embodiment of the present disclosure, a semiconductor device includes an internal circuit connected to a power pad receiving a power voltage and a signal pad inputting and outputting a signal, a first inductor element connected between at least one of the power pad and the signal pad, and the internal circuit, a second inductor element disposed adjacent to the first inductor element, and a monitoring element connected to the second inductor element, wherein the internal circuit determines whether an inflow of an overcurrent flowing from at least one of the power pad and the signal pad to the first inductor element has occurred by detecting a voltage determined according to properties of the second monitoring element.

BRIEF DESCRIPTION OF DRAWINGS

Embodiments of the present disclosure will be more clearly understood from the following detailed description, taken in combination with the accompanying drawings, in which.

DETAILED DESCRIPTION

Hereinafter, embodiments of the present disclosure will be described with reference to the accompanying drawings.

When discussing elements herein, the terms "at least one of "a" and "b" are to be understood as being non-conjunctive. In other words, the aforementioned term may be refer to one of "a" without "b". Alternatively, the aforementioned term may refer to one of "b", without "a". In addition, there can be both one of "a" and one of "b", but this is not a requirement.

Figure 1:
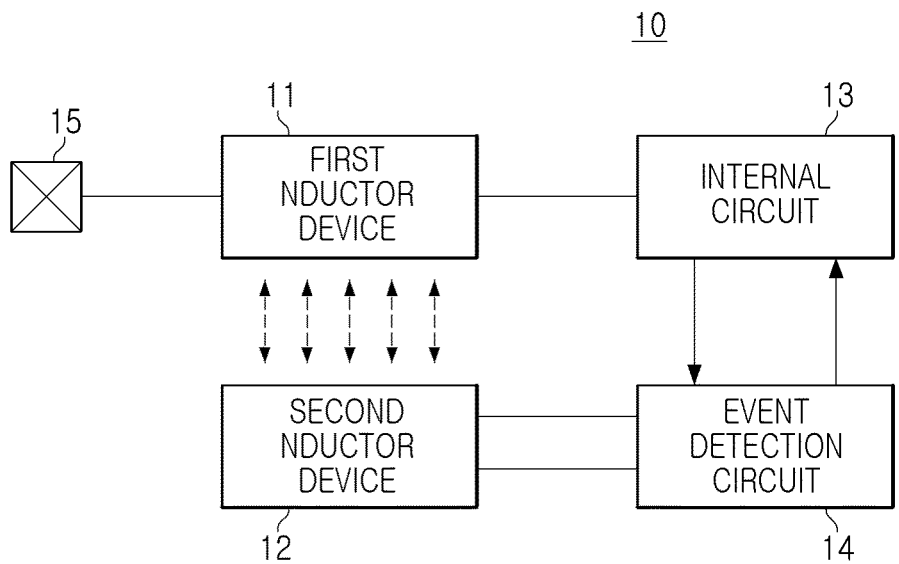
FIG. 1 is a block diagram illustrating a semiconductor device according to an example embodiment of the present disclosure.

FIG. 1 is a block diagram illustrating a semiconductor device according to an example embodiment.

Referring to FIG. 1, a semiconductor device 10 in an example embodiment includes a first inductor element 11, a second inductor element 12, an internal circuit 13, and an event detection circuit 14. The first inductor element 11 and the second inductor element 12 are inductively coupled to each other. In other words, when a current flows in one of the first inductor element 11 and the second inductor element 12, an induced voltage is generated by electromagnetic induction.

The first inductor element 11 is connected between the pad 15 and the internal circuit 13. Although FIG. 1 shows a single pad 15 for illustrative purposes, other embodiments may include a plurality of pads to receive power from an external entity or to input/output signals to and from a plurality of components. In this example embodiment, an electrostatic discharge (ESD) protective circuit is connected between the first inductor element 11 and the internal circuit 13.

The internal circuit 13 is configured to perform an actual operation of the semiconductor device 10. For example, when the semiconductor device 10 is implemented as a memory device, the internal circuit 13 may include a peripheral circuit region performing a program operation for storing data, a read operation for reading stored data, and an erase operation for deleting stored data, and a cell region including memory cells. When the semiconductor device 10 is implemented as an application processor, the internal circuit 13 may include at least one core, a graphics processing unit, a power supply circuit, and an interface circuit.

The second inductor element 12 is disposed adjacent to the first inductor element 11 to inductively couple to the first inductor element 11. The second inductor is connected to the event detection circuit 14. As shown in FIG. 1, both ends of the second inductor element are connected to the event detection circuit 14. The event detection circuit 14 includes at least one monitoring element connected to the second inductor element 12, and a sensing circuit configured to detect changes in properties of the monitoring element. For example, properties of the monitoring element may change by an induced voltage and/or an induced current generated in the second inductor element 12 by electromagnetic induction, and the sensing circuit may detect changes in properties of the monitoring element.

The event detection circuit 14 operated under control of the internal circuit 13. For example, when an overcurrent flows into the first inductor element 11 through the pad 15 while the event detection circuit 14 is electrically isolated from the internal circuit 13, an induced voltage may be generated in the second inductor element 12 due to an electrostatic charge or overcurrent. The event detection circuit 14 includes properties that changes due to an induced voltage generated in the second inductor element 12 and/or an induced current flowing in the second inductor element 12.

When the semiconductor device 10 receives power from an external entity and starts an operation, the internal circuit 13 may supply power necessary for operation of the event detection circuit 14, and may detect changes in properties of the monitoring element through the event detection circuit 14. The internal circuit 13 may determine whether an event in which an overcurrent flows into the first inductor element 11. For example, the internal circuit determines if a transient event has occurred by detecting changes in properties of the monitoring element in the form of voltage and/or current. In an example embodiment, the transition event may occur by a surge, static electricity, or the like.

In an example embodiment, when an overcurrent flows into the first inductor element 11 due to an event, whether an event has occurred may be written in the monitoring element in a manner in which induced voltage induced to the second inductor element 12 generates changes in properties of the monitoring element. Also, since changes in properties of the monitoring element may appear differently depending on an overcurrent and intensity of the induced voltage generated accordingly, intensity of the event may be determined using the changes.

An overcurrent generated by various events such as human body model (HBM), human metal model (HMM), Charged-Device Model (CDM), charged board event (CBE), cable discharge event (CDE), surge, static electricity, and burst may flow into the semiconductor device 10 through the pad 15. However, as described above, an ESD protective circuit may be connected between the pad 15 and the internal circuit 13, and the ESD protective circuit may protect the internal circuit 13 by blocking an overcurrent from being transmitted to the internal circuit 13.

However, the internal circuit 13 may be protected by blocking an overcurrent and simultaneously, it may be necessary to write the event causing the overcurrent. By writing and monitoring the event causing the overcurrent, risk factors which may cause defects in the semiconductor device 10 in production, manufacturing, and transportation circumstances of the semiconductor device 10 may be effectively managed. In an example embodiment, an induced voltage may be generated in the second inductor element 12 due to the overcurrent flowing into the first inductor element 11, and an induced voltage and/or an induced current flowing therefrom may permanently damage the monitoring element included in the event detection circuit 14, thereby writing whether an overcurrent has occurred and intensity of the overcurrent. Accordingly, the possibility and cause of various events which may damage the semiconductor device 10 may be effectively monitored and managed.

Figure 2:
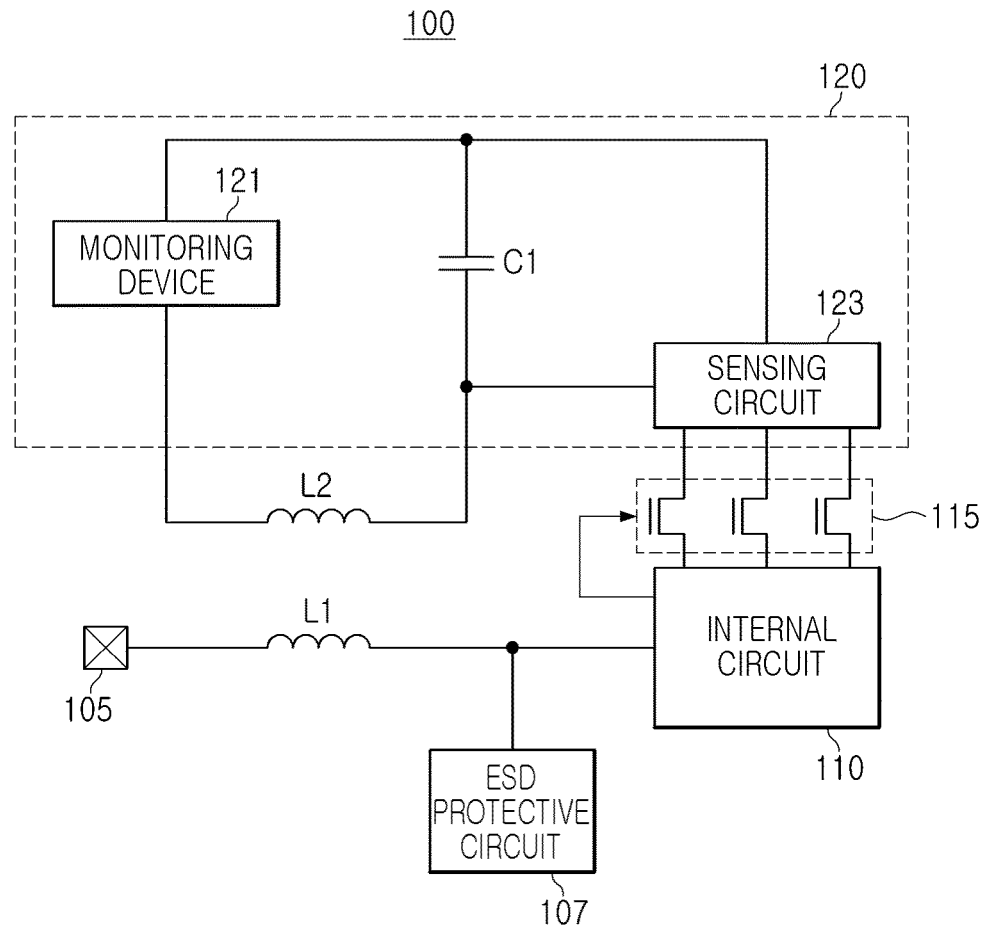
FIGS. 2 and 3 are diagrams illustrating operations of a semiconductor device according to an example embodiment of the present disclosure.
Figure 3:
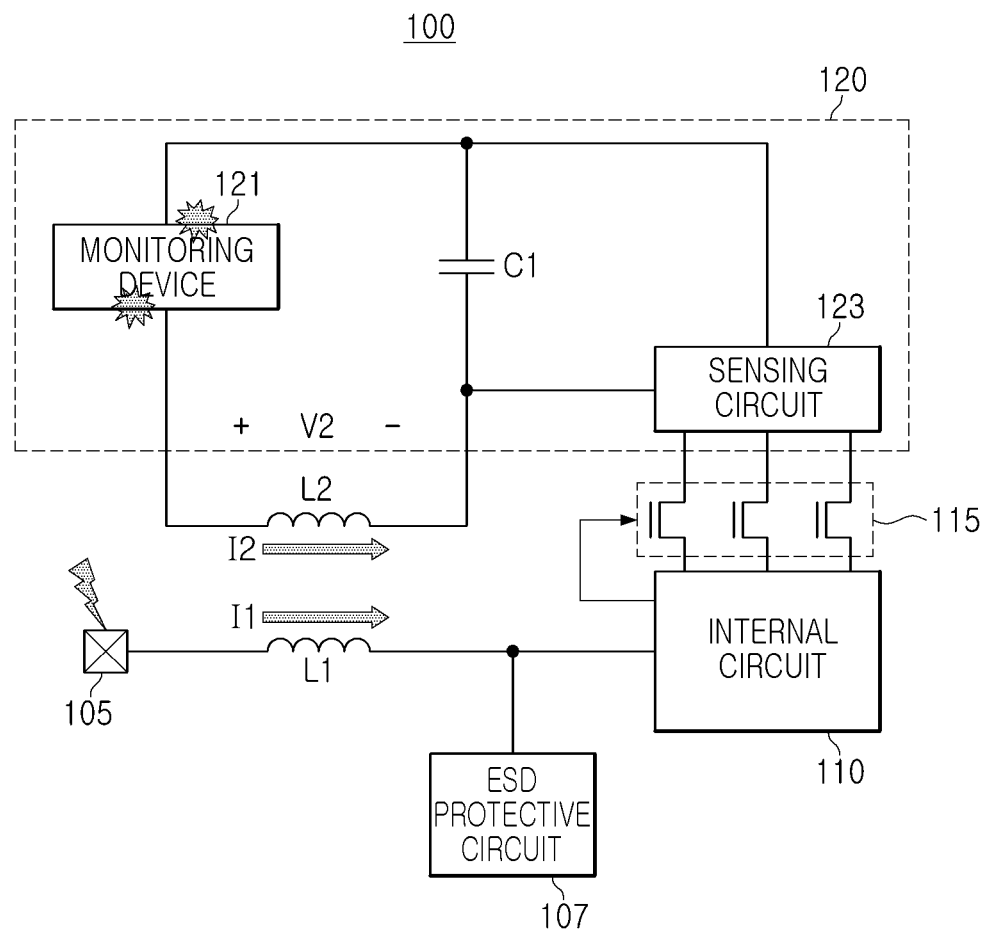

FIGS. 2 and 3 are diagrams illustrating operations of a semiconductor device according to an example embodiment.

Referring to FIG. 2, a semiconductor device 100 in an example embodiment may include a first inductor element L1 connected to a pad 105 and a second inductor element L2 coupled to the first inductor element L1. The first inductor element L1 may be connected to the internal circuit 110, and an Electrostatic discharge (ESD) protective circuit 107 that protects the internal circuit 110 from an overcurrent flowing into the first inductor element L1 may be connected between the first inductor element L1 and the internal circuit 110.

The second inductor element L2 may be connected to the monitoring element 121 and the sensing circuit 123. For example, one end of the second inductor element L2 may be connected to the monitoring element 121, and the other end of the second inductor element L2 may be connected to the sensing circuit 123. In the example embodiments, a blocking capacitor C1 for blocking a DC component may be connected between the monitoring element 121 and the second inductor element L2.

The monitoring element 121 may be implemented as one or more devices such as a field effect transistor, a bipolar junction transistor, a floating gate transistor, a diode, and an E-Fuse. The sensing circuit 123 may include a circuit outputting a voltage indicating properties of the monitoring element 121. For example, when the monitoring element 121 includes a field effect transistor, and an induced voltage is generated in the second inductor element L2 due to an overcurrent flowing into the first inductor element L1, at least a portion of the gate insulating layer included in the field effect transistor may be damaged. The sensing circuit 123 may include a circuit for detecting changes in properties of the monitoring element 121 due to the induced voltage generated in the second inductor element L2 as an event detection signal in the form of voltage and/or current as described above.

The sensing circuit 123 may be connected to the internal circuit 110 through and a plurality of switches 115, and in a circumstance in which an inflow of overcurrent through the pad 105 is detected, the plurality of switches 115 may maintain an turned-off state. For example, the plurality of switches 115 may be turned on and off by the internal circuit 110. For example, the internal circuit 110 may turn on the plurality of switches 115 and may supply power to the sensing circuit 123, and may determine whether an event causing an overcurrent has occurred by receiving an event detection signal output by the sensing circuit 123.

Referring to FIG. 3, when a transition event such as a surge or static electricity has occurred in a region adjacent to the pad 105, a first current I1 may flow in the first inductor element L1. In an example embodiment, the first current I1 may be an overcurrent which may damage the internal circuit 110, and in this case, the ESD protective circuit 107 may operates to prevent damages to the internal circuit 110 caused by the first current I1. In an example embodiment, even when damages to the internal circuit 110 is prevented by operating the ESD protective circuit 107, the second inductor element L2 and the event detection circuit 120 may be used to write and monitor whether an event has occurred.

When the first current I1 flows in the first inductor element L1, the second voltage V2, which is an induced voltage, may be generated in the second inductor element L2 by electromagnetic induction. The second voltage V2 and/or the second current I2 may damage the monitoring element 121 (as shown by the splats in FIG. 3), which may change properties of the monitoring element 121. The sensing circuit 123 may receive a power voltage required for operation from the internal circuit 110 when the plurality of switches 115 are turned on by the internal circuit 110. When the sensing circuit 123 starts operating, the internal circuit 110 may receive an event detection signal indicating changes in properties of the monitoring element 121 from the sensing circuit 123, and may determine whether the event causing the first current I1 to flow based on the event detection signal. Accordingly, regardless of the protection operation of the ESD protective circuit 107, whether an event which may damage the internal circuit 110 has occurred may be written in the monitoring element 121, and whether the event occurs may be determined later.

Figure 4:
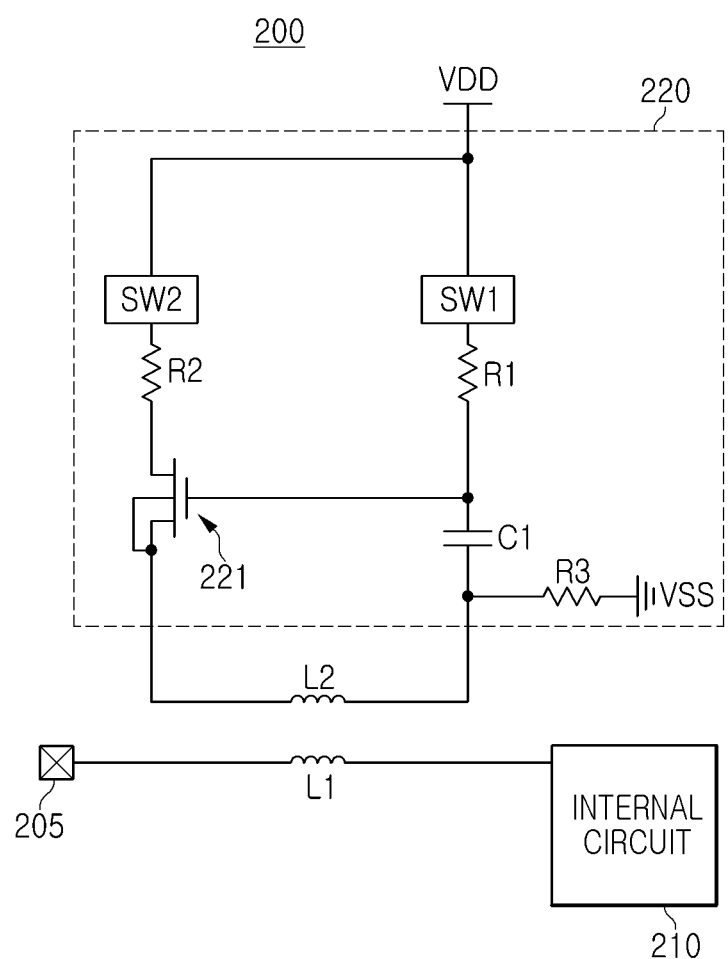
FIGS. 4 and 6 are diagrams illustrating a semiconductor device according to an example embodiment of the present disclosure.
Figure 6:
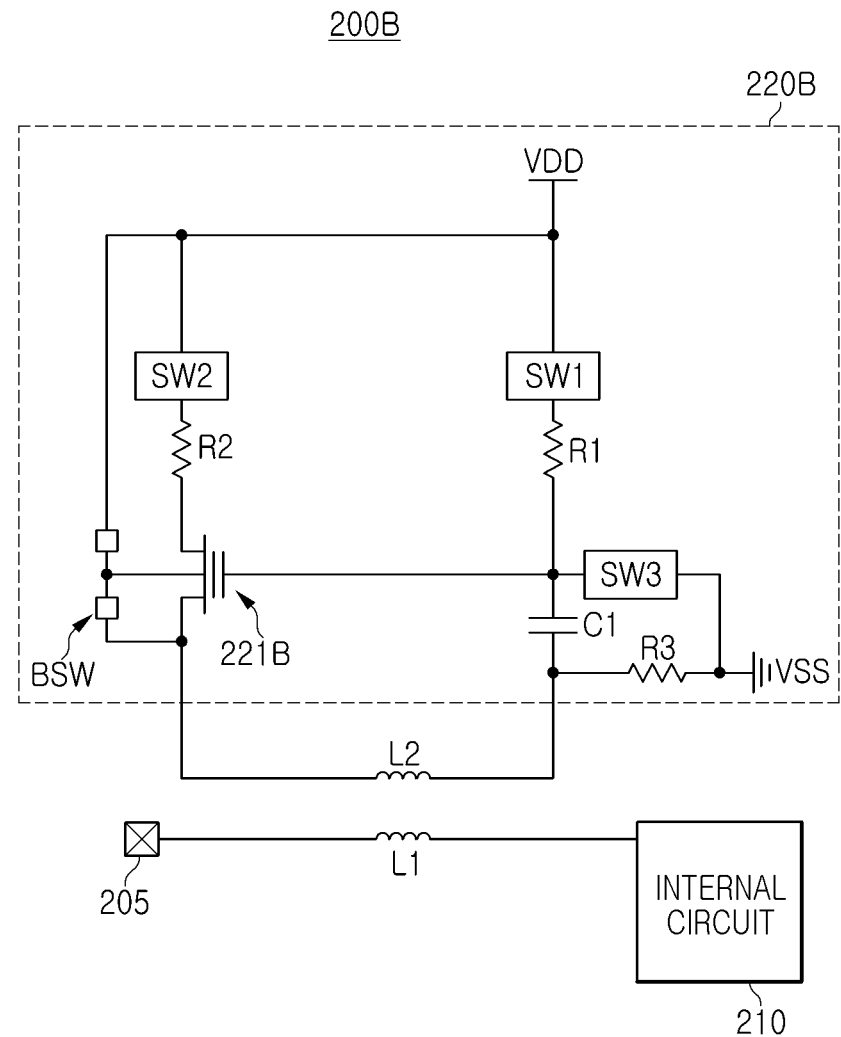

FIGS. 4 and 6 are diagrams illustrating a semiconductor device according to an example embodiment.

Figure 5:
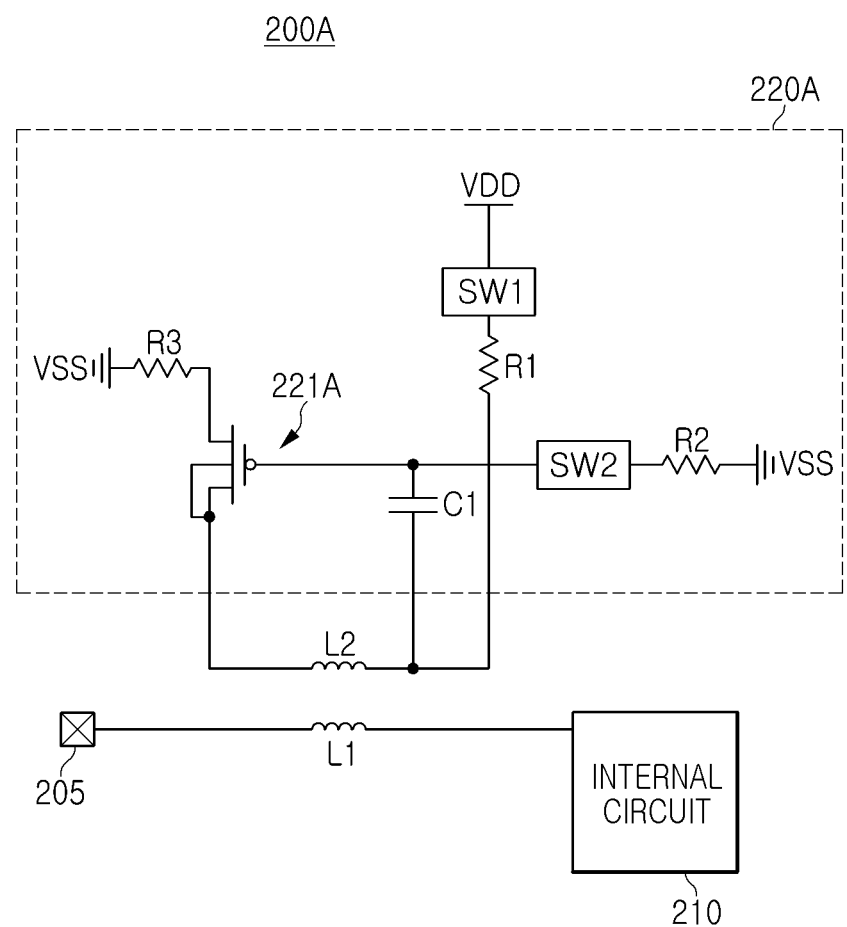

FIGS. 4 to 6 may be circuit diagrams illustrating the configuration of the event detection circuit according to various monitoring elements. In the example embodiment illustrated in FIG. 4, a semiconductor device 200 may include an NMOS transistor as the monitoring element 221. In the example embodiment illustrated in FIG. 5, the semiconductor device 200A may include a PMOS transistor as the monitoring element 221A, and in the example embodiment illustrated in FIG. 6, the semiconductor device 200B may include a floating gate transistor as the monitoring element 211B.

Referring to FIG. 4, the semiconductor device 200 in an example embodiment may include a first inductor element L1 and a second inductor element L2 coupled to the first inductor element L1. One end of the second inductor element L2 may be connected to the monitoring element 221, and the monitoring element 221 may be implemented as an NMOS transistor in which a source terminal is connected to a body terminal.

The source terminal of the monitoring element 221 may be connected to the second inductor element L2, and a gate terminal of the monitoring element 221 may be connected to a blocking capacitor C1 and a first resistor R1. The first resistor R1 may receive a first power voltage VDD through a first switch SW1. A node between the blocking capacitor C1 and the second inductor element L2 may receive a second power voltage VSS smaller than the first power voltage VOD through a third resistor R3. The monitoring element 221 may receive the first power voltage VDD through the second resistor R2 and a second switch device SW2.

In the circuit illustrated in FIG. 4, the first power voltage VDD and the second power voltage VSS may be supplied by the internal circuit 210, and when a transition event such as surge or static electricity occurs, the internal circuit 210 prevents supply of the first power voltage VDD and the second power voltage VSS to the event detection circuit 220 by controlling the first switch SW1 and the second switch SW2.

Referring to FIG. 5, the monitoring element 221A may include a PMOS transistor. In the PMOS transistor providing the monitoring element 221A, a body terminal may be connected to a source terminal, and a gate terminal may receive a second power voltage VSS through the second resistor R2 and the second switch SW2. Also, a gate terminal of the monitoring element 221A may be connected to the blocking capacitor C1. The other components included in the event detection circuit 220A may be similar to those discussed in the aforementioned example embodiment described with reference to FIG. 4.

Referring to FIG. 6, a monitoring element 221B may be provided by a floating gate transistor. In the example embodiment in FIG. 6, a gate terminal of the monitoring element 221B may receive a first power voltage VDD through a first resistor R1 and a first switch SW1, or may receive a second power voltage VSS through a third switch SW3. Also, a gate terminal of the monitoring element 221B may be connected to a blocking capacitor C1. At least one body switch BSW may be connected to a body terminal of the monitoring element 221B, and one of the body switches BSW may receive the first power voltage VDD.

For example, in the example embodiment illustrated in FIG. 6, when air overcurrent flows into the first inductor element L1 and an induced voltage is generated in the second inductor element L2 due to the overcurrent, electric charges may be accumulated in a floating gate of the monitoring element 221B due to the induced voltage flowing in the second inductor element L2 caused by the induced voltage and/or the induced voltage. Thereafter, the internal circuit 210 may supply the power voltages VDD and VSS to the event detection circuit 220B, and may control the switches SW1-SW3 to detect charges in a threshold voltage of the monitoring element 221B caused by the electric charges accumulated in the floating gate, thereby determining whether an event causing an overcurrent to flow has occurred and/or an intensity of the event.

When the determination of whether the event has occurred and nor intensity of the event is completed, the internal circuit 210 may turn off the second switch SW2 and may turn on the third switch SW3, and may turn on the body switch BSW of the monitoring element 221B and may input the first power voltage VDD to the body terminal of the monitoring element 221B. Accordingly, electric charges accumulated in the floating gate may be removed through the body terminal of the monitoring element 221B, and accordingly, a threshold voltage of the monitoring element 221B may be initialized. In the example embodiment illustrated in FIG. 6, the monitoring element 221B may be initialized and reused in the same manner as above, and accordingly, an event causing an overcurrent to flow may be detected using the monitoring element 221B.

Figure 7:
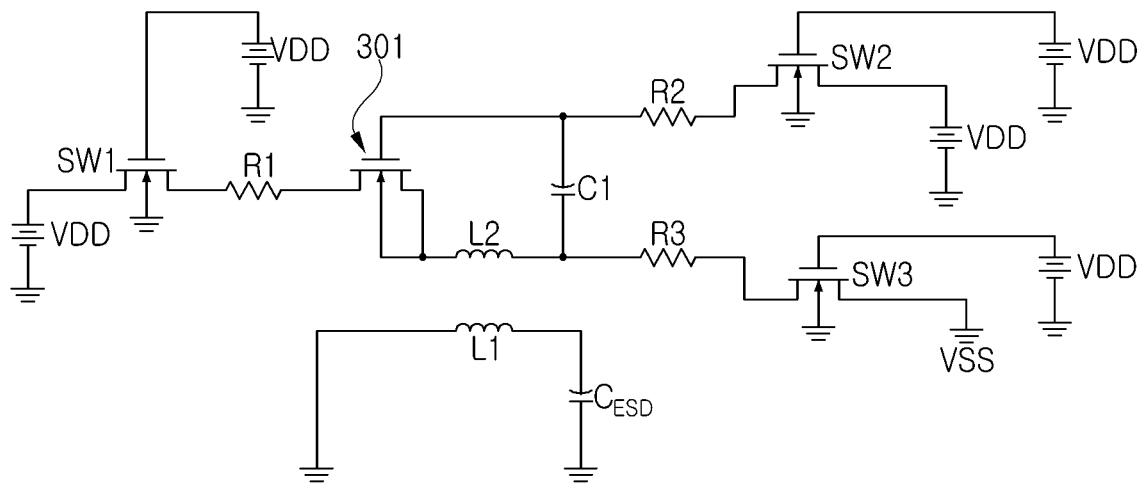
FIGS. 7 and 8 are circuit diagrams illustrating operations of an event detection circuit included in a semiconductor device according to an example embodiment of the present disclosure.
Figure 8:
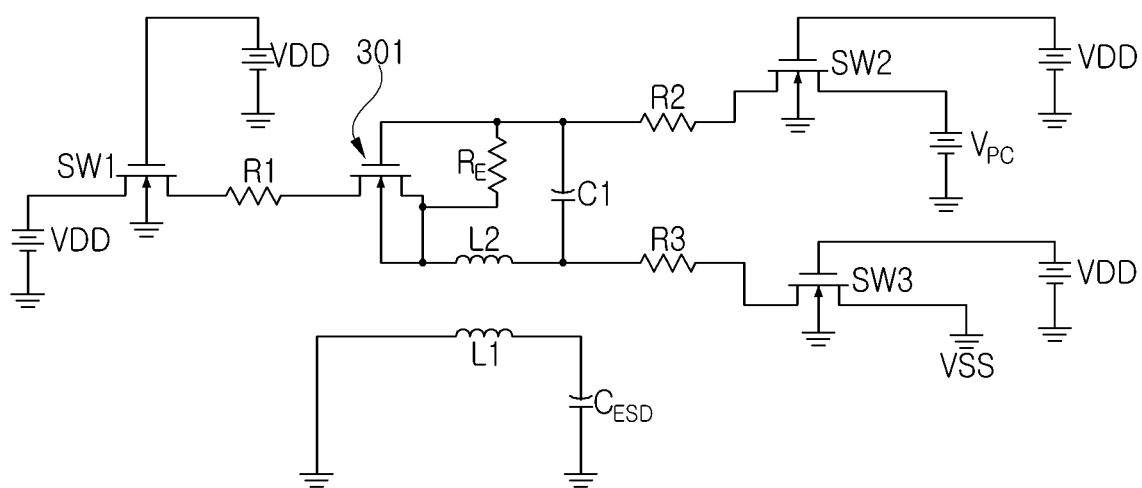
Figure 9:
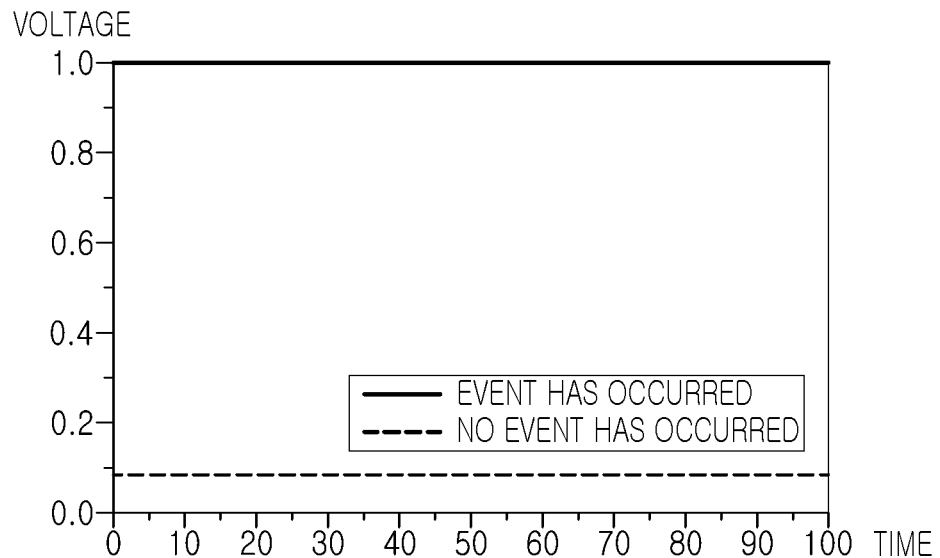
FIGS. 9 and 10 are diagrams illustrating operations of an event detection circuit included in a semiconductor device according to an example embodiment of the present disclosure.
Figure 10:
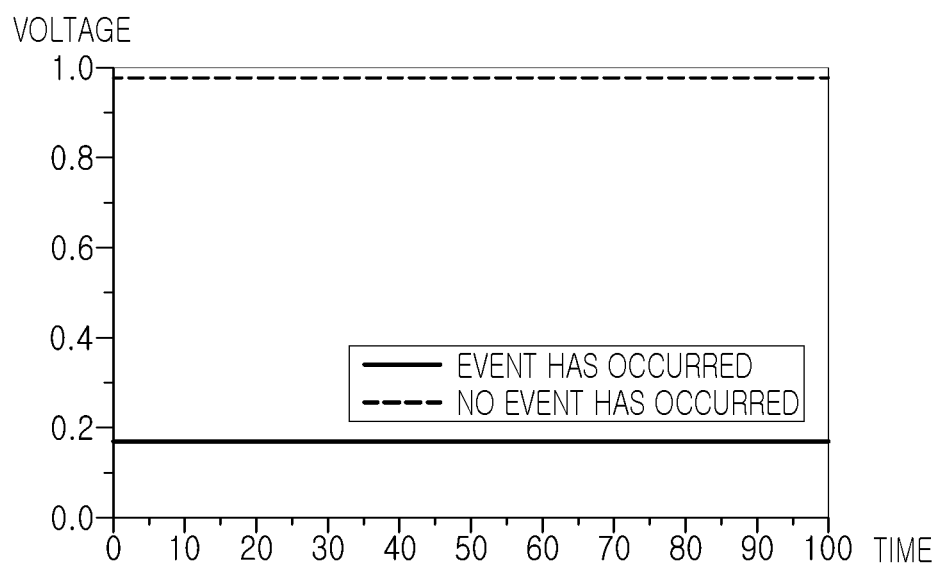

FIGS. 7 and 8 are circuit diagrams illustrating operations of an event detection circuit included in a semiconductor device according to an example embodiment. FIGS. 9 and 10 are diagrams illustrating operations of an event detection circuit included in a semiconductor device according to an example embodiment.

FIGS. 7 and 8 are equivalent circuit diagrams illustrating operation of an event detection circuit included in a semiconductor device 300 according to an example embodiment, and for example, the monitoring element 301 may be implemented as an NMOS transistor. Accordingly, a connection structure between the monitoring element 301, the second inductor element L2, and the blocking capacitor C1 may be similar to the structure in the aforementioned example embodiment described with reference to FIG. 4. As in the aforementioned example embodiment, the second inductor element L2 may be coupled to the first inductor element L1, and one end of the first inductor element L1 may be connected to a protective capacitor $C_{ESD}$ corresponding to an equivalent circuit of an electrostatic protective circuit.

FIG. 7 corresponds to an example embodiment in which the transition event does not cause an overcurrent flow into the first inductor element L1, and FIG. 8 corresponds to an embodiment in which an overcurrent flows into the first inductor element L1, and electromagnetically induces the second inductor element L2 to generate an induced voltage. The internal circuit may turn on the first to third switches SW1-SW3 to supply the first power voltage VDD and the second power voltage VSS, and may detect a voltage of a sensing node corresponding to a drain terminal of the monitoring element 301 as an event detection signal. Also, in an example embodiment, the internal circuit may further detect a voltage corresponding to a gate terminal of the monitoring element 301.

FIG. 9 may be a diagram illustrating a voltage of the sensing node in each of the example embodiments illustrated in FIGS. 7 and 8, and FIG. 10 may be a diagram illustrating a voltage of a gate terminal of the monitoring element 301 in each of the example embodiments illustrated in FIGS. 7 and 8. Hereinafter, an operation of the event detection circuit included in the semiconductor device 300 will be described with reference to FIGS. 7 to 10.

Referring to FIG. 7, in an example embodiment in which a transition event does not occur, the monitoring element 301 may not be damaged. When the internal circuit supplies the first power voltage VDD and the second power voltage VSS and the first to third switches SW1-SW3 are turned on the monitoring element 301 may be turned on, and the internal circuit may sense a voltage of the sensing node corresponding to the drain terminal of the monitoring element 301 as a voltage close to the second power voltage VSS as illustrated in FIG. 9.

In the example embodiment illustrated in FIG. 7, since the gate insulating layer included in the monitoring element 301 is not damaged, a voltage substantially equal to the first power voltage VDD may be input to the gate terminal. Accordingly, as illustrated in FIG. 10, the internal circuit may sense the gate voltage of the monitoring element 301 as a voltage similar to the first power voltage VDD.

Referring to FIG. 8, in an example embodiment in which a transition event has occurred, the monitoring element 301 may be damaged. For example, the gate insulating layer included in the monitoring element 301 may be damaged, which may be represented as an event resistor $R_E$ connecting the gate terminal, the source terminal, and the body terminal of the monitoring element 301 on an equivalent circuit as illustrated in FIG. 8.

As illustrated in FIG. 8, in a state in which a current path is formed due to the event resistor $R_E$, when the internal circuit supplies the first power voltage VDD and the second power voltage VSS, and the first to third switches SW1-SW3 are turned on, a voltage of the gate terminal of the monitoring element 301 may be reduced through the event resistor $R_E$. Accordingly, as illustrated in FIG. 10, the voltage of the gate terminal detected by the internal circuit from the event detection circuit after the transition event has occurred may be sensed as a value approximate to the second you voltage VSS.

Also, as the event resistor $R_E$ is generated, the voltage of the gate terminal of the monitoring element 301 may decrease and the monitoring element 301 may not be turned on. Accordingly, the voltage of the sensing node detected by the internal circuit from the event detection circuit after the transition event has occurred may be substantially similar to the first power voltage VDD as illustrated in FIG. 10.

As illustrated with reference to FIGS. 7 to 10, in an example embodiment, determining whether the monitoring element 301 has been damaged may be detected by sensing at least one of the voltage of the drain terminal of the monitoring element 301 connected to the second inductor element L2 and the voltage of the gate terminal of the monitoring element 301, and whether a transition event causing an overcurrent to flow has occurred may be determined therefrom.

Figure 11:
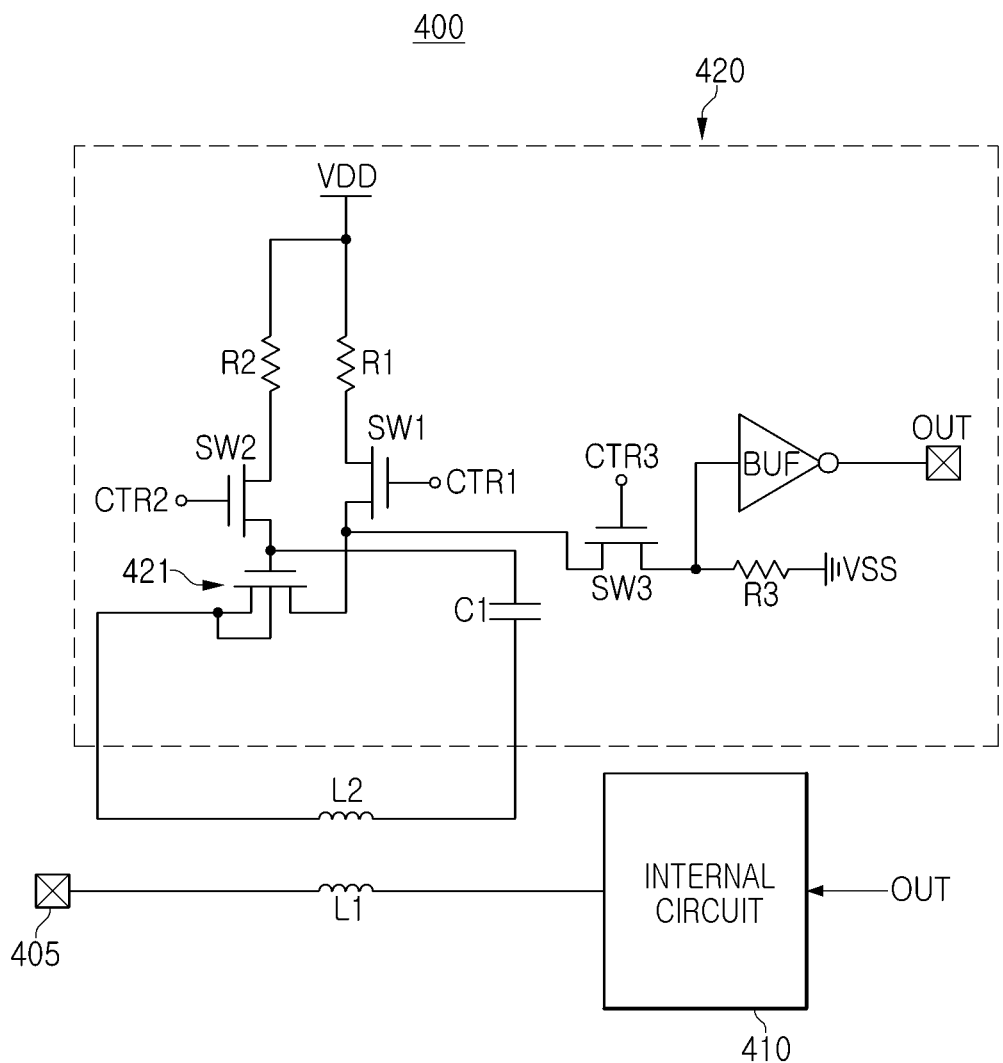
FIGS. 11 and 12 are diagrams illustrating a semiconductor device according to an example embodiment of the present disclosure.
Figure 12:
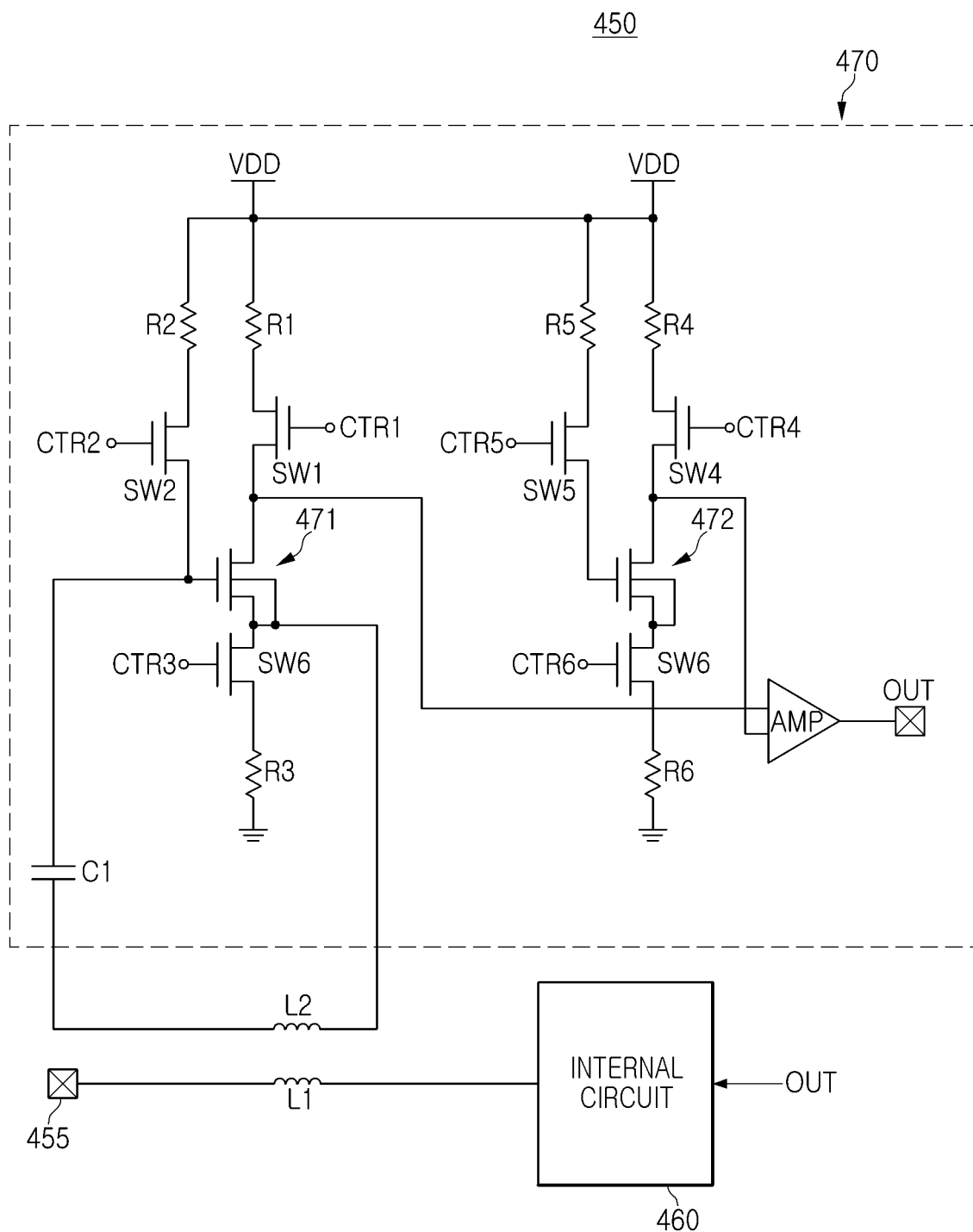

FIGS. 11 and 12 are diagrams illustrating a semiconductor device according to an example embodiment.

Referring to FIG. 11, a semiconductor device 400 in an example embodiment may include a first inductor element L1, a second inductor element L2, an internal circuit 410 connected to the first inductor element, and an event detection circuit 420 connected to the second inductor element L2. The first inductor element L1 may be connected between the pad 405 and the internal circuit 410, and an overcurrent generated due to a transition event such as surge or static electricity may flow to the first inductor element L1.

The second inductor element L2 may be coupled to the first inductor element L1. Accordingly, when an overcurrent due to the transition event flows into the first inductor element L1, an induced voltage may be generated in the second inductor element L2 due to electromagnetic induction. When an excessively large voltage is induced at the second inductor element L2, the monitoring element 421 connected to the second inductor element L2 may be damaged. As described above, in an example embodiment, when a transition event has occurred, whether the event has occurred may be written by damaging the monitoring element using the induced voltage generated in the second inductor element L2.

In the example embodiment in FIG. 11, the event detection circuit 420 may include a sensing circuit for detecting at least one of a voltage of a gate terminal and a voltage of a drain terminal of the monitoring element 421. Referring to FIG. 11, the sensing circuit may include a blocking capacitor C1, first to third resistors R1-R3, first to third switches SW1-SW3, and a buffer BUF. The output terminal of the buffer BUF may output an event detection signal OUT, and the event detection signal OUT may be input to the internal circuit 410.

When an overcurrent flows in the first inductor element L1 as a transition event has occurred, an induced voltage may be generated in the second inductor element L2 due to electromagnetic induction, and the monitoring element 421 may be damaged due to the induced voltage. Due to such damage, properties of the monitoring element 421 may change.

The internal circuit 410 may supply a first power voltage VDD and a second power voltage VSS to the event detection circuit 420 to detect changes in properties of the monitoring element 421, and controls the first to third switch control signals CTR1-CTR3 to be transitioned to a high logic such that the first to third switches SW1 to SW3 are turned on. When the monitoring element 421 is damaged due to the transition event, a voltage of the drain terminal of the monitoring element 421 is increased as described above. In the example embodiment in FIG. 11, when the event detection signal OUT has a voltage corresponding to a high logic value, the internal circuit 410 may determine that an event causing an overcurrent to flow into the pad 405 has occurred.

Referring to FIG. 12, a semiconductor device 450 in an example embodiment may include a first inductor element L1, a second inductor element L2, a first inductor element 460 connected to the first inductor element and an event detection circuit 470 connected to the second inductor element L2. The first inductor element L1 may be connected between the pad 455 and the internal circuit 460, and an overcurrent generated due to a transition event such as surge or static electricity may flow to the first inductor element L1.

The second inductor element L2 may be coupled to the first inductor element L1, and when an overcurrent due to a transition event flows into the first inductor element L1, an induced voltage may be generated due to electromagnetic induction. When an excessively large induced voltage is generated in the second inductor element L2, the monitoring element 471 connected to the second inductor element L2 may be damaged. As described above, in an example embodiment, when a transition event has occurred, whether the event has occurred may be written by damaging the monitoring element using the induced voltage flowing in the second inductor element L2.

In an example embodiment illustrated in FIG. 12, the event detection circuit 470 may include a sensing circuit for detecting a voltage of a sensing node of the monitoring element 471. Referring to FIG. 12, the sensing circuit may include a reference element 472, a blocking capacitor C1, first to sixth resistors R1-R6, first to sixth switches SW1-SW6, and an operational amplifier AMP. The output terminal of the operational amplifier AMP ma output the event detection signal OUT, and the event detection signal OUT may be input to the internal circuit 460.

The operational amplifier AMP may, after the event detection circuit 470 receives the first power voltage VDD and the second power voltage VSS from the internal circuit 460, amplify a voltage difference between the voltage of the monitoring element 471 and the voltage of the reference element 472 and may output the event detection signal OUT. The event detection signal OUT may be a voltage signal, and a magnitude thereof may be proportional to a difference in voltages. Accordingly, when the event detection circuit 470 is configured as in the example embodiment illustrated in FIG. 12, the internal circuit 460 may determine a degree of intensity of the event causing an overcurrent to flow.

When an overcurrent flows in the first inductor element L1 due to a transition event, an induced voltage may be generated in the second inductor element L2 due to electromagnetic induction, and the induced voltage and/or an induced current flowing due to the induced voltage may damage the monitoring element 471. Due to such damage, properties of the monitoring element 471 may change. However, differently from the monitoring element 471, properties of the reference element 472 may not change.

The internal circuit 460 may supply the first power voltage VDD and the second power voltage VSS to the event detection circuit 470 to detect changes in properties of the monitoring element 471, and may allow the first to sixth switch control signals CTR1 to CTR6 to high logic, such that the first to sixth switches SW1 to SW6 may be turned on. When the monitoring element 471 is damaged due to an overcurrent flowing in the first inductor element L1, a voltage of the sensing node of the monitoring element 471 may increase.

In the example embodiment illustrated in FIG. 12, the operational amplifier AMP may amplify a difference between the voltages input from the monitoring element 471 and the reference element 472 and may output the event detection signal OUT. As the magnitude of an overcurrent flowing in the first inductor element L1 increases, the magnitude of the induced voltage flowing in the second inductor element L2 may increase. Accordingly, as the voltage of the event detection signal OUT increases, the internal circuit 460 may determine that the monitoring element 471 is significantly damaged, and accordingly, the internal circuit 460 may determine that intensity of the transition event causing an overcurrent to flow is great.

In an example embodiment, the first inductor element connected to the internal circuit may be connected between a pad receiving a power voltage and an internal circuit, or between a pad receiving a signal and an internal circuit. Also, the first inductor element may be connected to an ESD device and an ESD clamper circuit such that an overcurrent flowing in the first inductor element does not flow into the internal circuit and does not permanently damage the internal circuit due to the transition event. Hereinafter, the configuration will be described in greater detail with reference to FIG. 13.

Figure 13:
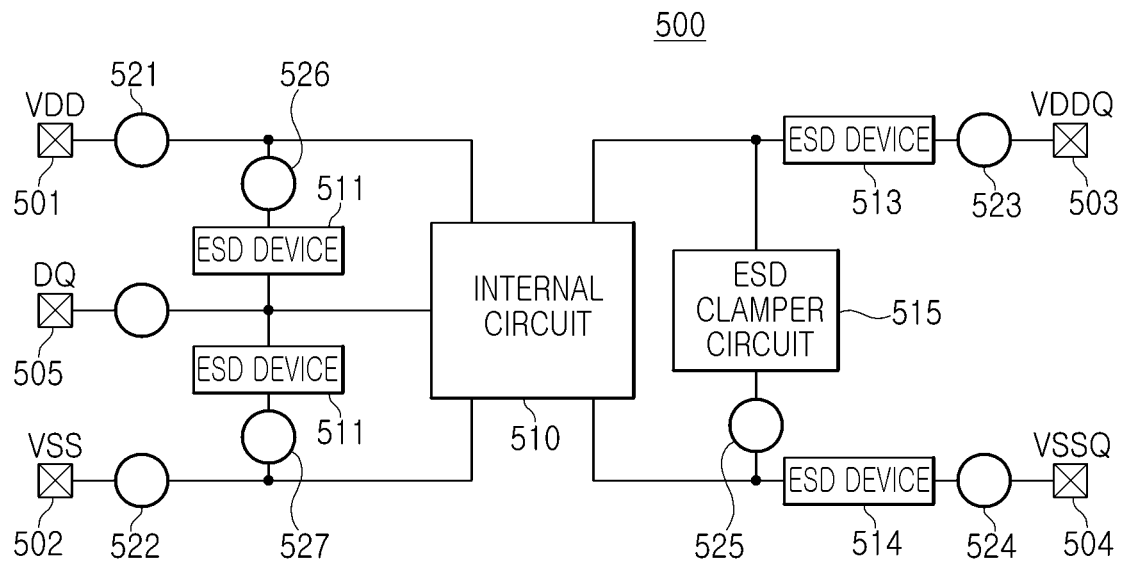
FIG. 13 is a block diagram illustrating a semiconductor device according to an example embodiment of the present disclosure.

FIG. 13 is a block diagram illustrating a semiconductor device according to an example embodiment.

Referring to FIG. 13, a semiconductor device 500 in an example embodiment may include a plurality of pads 501-505, an internal circuit 510, an ESD protective circuit

511-515. The plurality of pads 501-505 may include power supply pads 501-504 receiving power voltages VDD, VSS, VDDQ, and VSSQ, and a signal pad 505 receiving a data signal DQ. For example, the semiconductor device 600 may receive first and second power voltages VDD and VSS necessary for operation of the internal circuit 510 through the first and second power supply pads VDD and VSS, and may receive the third and fourth power voltages VDDQ and VSSQ necessary for data input/output through the third and fourth power supply pads VDDQ and VSSQ.

The ESD protective circuit 511-515 may include a plurality of ESD devices 511-514 and an ESD clamp circuit 515. The plurality of ESD devices 511-514 may include devices such as diodes.

A least one of paths connecting the plurality of pads 501-505 to the internal circuit 510 may include an inductor element in which an overcurrent input to the plurality of pads 501-505 flows due to a transition event. Referring to FIG. 13, an inductor element may be connected by selecting at least one of a plurality of candidate positions 521-528. To prevent an overcurrent flowing into the inductor element from flowing into the internal circuit 510, the inductor element may be connected to at least one of the ESD protective circuits 511-515.

In the example embodiment illustrated in FIG. 13, the semiconductor device 500 may be an integrated circuit chip, and a plurality of candidate positions 521-528 to which the inductor element may be connected may be present in the integrated circuit chip. For example, the inductor element connected to at least one of the plurality of candidate positions 521-528 may be disposed on a semiconductor substrate in the integrated circuit chip, and may be provided by at least a portion of wiring patterns connected to devices formed on the semiconductor substrate.

Figure 14:
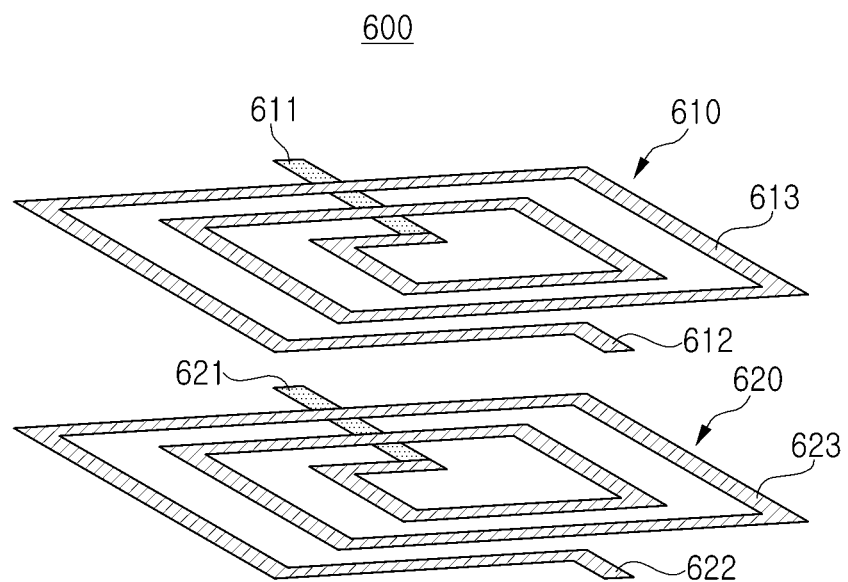
FIG. 14 is a diagram illustrating inductor elements included in a semiconductor device according to an example embodiment of the present disclosure.

FIG. 14 is a diagram illustrating inductor elements included in a semiconductor device according to an example embodiment.

Referring to FIG. 14, inductor elements 600 in an example embodiment may include a first inductor element 610 and a second inductor element 620, and each of the first inductor element 610 and the second inductor element 620 may include a spiral coil. The spiral coil providing the first inductor element 610 and the spiral coil providing the second inductor element 620 may be disposed parallel to each other.

The first inductor element 610 may include a first lead-out line 611, a second lead-out line 612, and a coil portion 613. As described above, the first inductor element 610 may be connected between one of a plurality of pads included in the semiconductor device and an internal circuit. For example, when the first lead-out 611 is connected to one of the plurality of pads, the second lead-out 612 may be connected to an internal circuit. In an example embodiment, at least one of the first lead-out line 611 and the second lead-out line 612 may be disposed on a level different from a level of the coil portion 613.

The structure of the second inductor element 620 may be similar to that of the first inductor element 610, and may include a first lead-out line 621, a second lead-out line 622, and a coil portion 623. As described above, the second inductor element 620 may be connected to an event detection circuit including a monitoring element. Accordingly, the first lead-out line 621 and the second lead-out line 622 may be connected to the event detection circuit, and for example, at least one of the first lead-out line 621 and the second lead-out line 622 may be directly connected to the monitoring element.

However, the structure of the inductor elements 600 may not be necessarily limited as illustrated in FIG. 14. In example embodiments, each of the inductor elements 600 may be provided by a linear-shaped wiring pattern extending in one direction. Also, the inductor elements 600 may be provided by a Rogowski coil.

In the example embodiment illustrated in FIG. 14, the number of turns of the first inductor element 610 may be the same the number of turns of the second inductor element 620 may be the same, but an example embodiment thereof is not limited thereto. According to an example embodiment, the number of turns of the first inductor element 610 may be greater than the number of turns of the second inductor element 620. In this case, the magnitude of the induced voltage generated in the second inductor element 620 due to a transition event may increase. Accordingly, the same transition event may cause greater damage to the monitoring element, and accordingly, an effect of increasing sensitivity of the event detection circuit with respect to the transition event may be obtained.

When the number of turns of the first inductor element 610 may be smaller than the number of turns of the second inductor element 620, the magnitude of the induced voltage induced in the second inductor element 620 may decrease. Accordingly, an effect of lowering sensitivity of the event detection circuit may be obtained.

When the semiconductor device is an integrated circuit chip, the first inductor element 610 and the second inductor element 620 may be disposed on a back-end-of-line (BEOL) providing wiring patterns connecting the semiconductor devices formed on the semiconductor substrate in an integrated circuit chip. For example, a portion of the wiring patterns connected to the semiconductor devices may provide the first inductor element 610 and the second inductor element 620.

When the inductor elements 600 are disposed in the BEOL layer in the integrated circuit chip, the first inductor element 610 may be a portion of a wiring pattern providing a path connecting one of the plurality of pads exposed externally of an integrated circuit chip to one of the semiconductor devices included in the internal circuit. Also, the second inductor element 620 may be connected to the event detection circuit isolated from the internal circuit and implemented in the integrated circuit chip, and may be isolated from the plurality of pads.

Also, in an example embodiment, when the semiconductor device is a semiconductor package, the first inductor element 610 and the second inductor element 620 may be provided by a portion of wiring patterns in the package substrate. In this case, the inductor elements 600 may not be disposed in the integrated circuit chip mounted on the package substrate in the semiconductor package. However, in example embodiments, the inductor elements 600 may be disposed on both the integrated circuit chip and the package substrate.

The first inductor element 610 disposed on the package substrate may be connected to one of a plurality of bumps formed on one surface of the package substrate, and may be connected to one of a plurality of micro-bumps formed on the other surface of the package substrate and connected to the integrated circuit chip. The second inductor element 620 may be connected to at least one of the plurality of micro-bumps connected to the integrated circuit chip, and may be isolated from the plurality of bumps formed on one surface of the package substrate.

Also, in an example embodiment, when the semiconductor device is a system including a printed circuit board and a semiconductor package mounted on the printed circuit board, the inductor elements 600 may be formed on the printed circuit board. The first inductor element 610 may be connected to at least one of a plurality of wiring pads formed on one side of the printed circuit board. For example, the plurality of wiring pads may provide an interface port for connecting the system to other systems or devices, and may be electrically connected to at least one of the bumps of the semiconductor package through wiring patterns of the printed circuit board. In other words, the first inductor element 610 disposed on the printed circuit board may be connected between at least one of the plurality of wiring pads and at least one of the plurality of bumps of the semiconductor package.

Differently from the first inductor element 610, the second inductor element 620 may be isolated from the plurality of wiring pads and may be connected to only a portion of the plurality of bumps included in the semiconductor package. Among the plurality of bumps included in the semiconductor package, a bump connected to the first inductor element 610 may be connected to an internal circuit of an integrated circuit chip included in the semiconductor package. Also, among the plurality of bumps included in the semiconductor package, a bump connected to the second inductor element 620 may be connected to an event detection circuit of an integrated circuit chip included in the semiconductor package.

Figure 15:
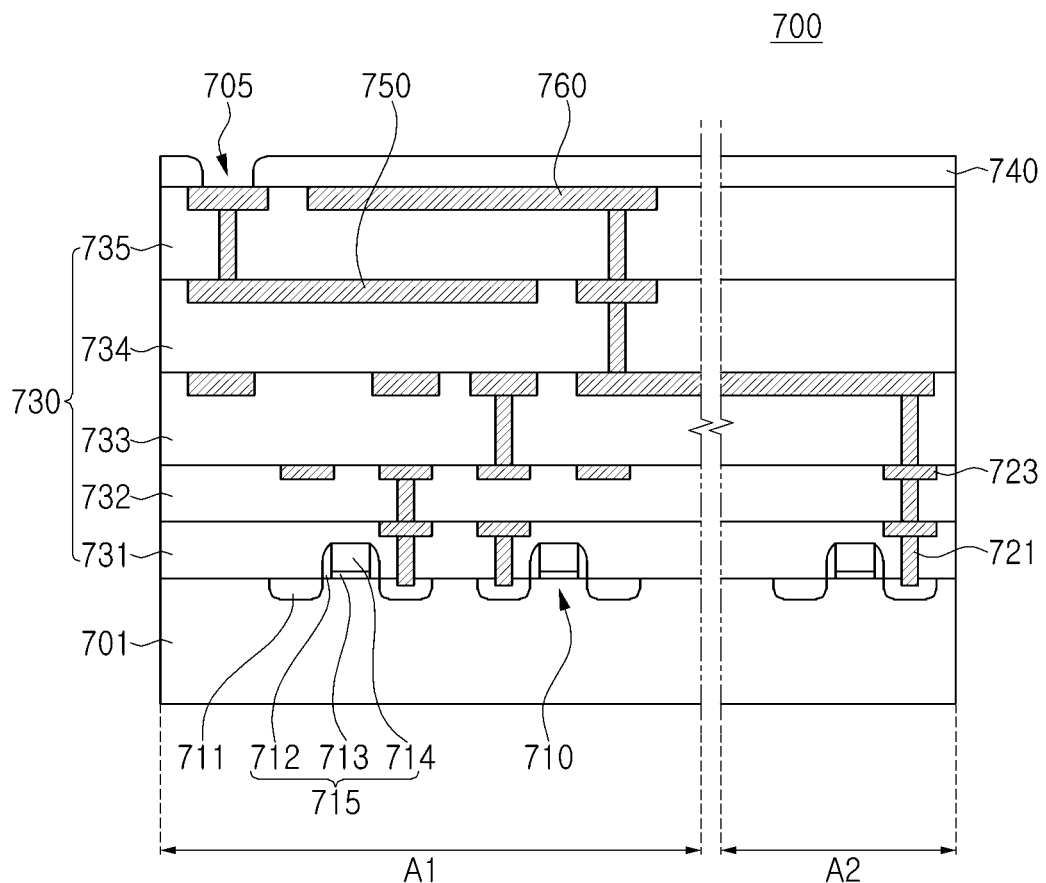
FIG. 15 is a diagram illustrating a semiconductor device according to an example embodiment of the present disclosure.

FIG. 15 is a diagram illustrating a semiconductor device according to an example embodiment.

FIG. 15 may be a diagram illustrating an example embodiment in which inductor elements are disposed in a semiconductor device 700 which may be an integrated circuit chip. Referring to FIG. 15, the semiconductor device 700 may include a semiconductor substrate 701 and a plurality of semiconductor devices 710 formed on the semiconductor substrate 701. A plurality of wiring patterns 721 and 723 may be disposed on the plurality of semiconductor devices 710, and the plurality of wiring patterns 721 and 723 may be formed in the plurality of interlayer insulating layers 731-735 (730).

The plurality of semiconductor devices 710 may include transistors formed on the semiconductor substrate 701. For example, each of the plurality of semiconductor devices 710 may include a source/drain region 711 and a gate structure 715. The gate structure 715 may include a gate spacer 712, a gate insulating layer 713, and a gate electrode layer 714.

The plurality of wiring patterns 721 and 723 may include a plurality of vias 721 and a plurality of wiring layers 723. In the example embodiment illustrated in FIG. 15, the plurality of wiring patterns 721 and 723 may be disposed in five interlayer insulating layers 730, but the number of interlayer insulating layers 730 may be varied in example embodiments.

Among the plurality of wiring patterns 721 and 723, at least a portion of the wiring layer 723 disposed on an uppermost layer may be exposed externally by the passivation layer 740 and may provide the pad 705. Referring to FIG. 15, the first inductor element 750 may be implemented by the wiring layer 723 connected to the pad 705. The first inductor element 750 may have a spiral coil shape as described in the aforementioned example embodiment with reference to FIG. 14. However, the shape of the first inductor element 750 may be varied in example embodiments.

A second inductor element 760 disposed parallel to the first inductor element 750 may be formed in the semiconductor device 700. In the example embodiment illustrated in FIG. 15, the second inductor element 760 is disposed on the first inductor element 750, but alternatively, the second inductor element 760 may be disposed below the first inductor element 750. The shape of the second inductor element 760 may be the same as or different from the shape of the first inductor element 750. The first inductor element 750 and the second inductor element 760 are disposed adjacent to each other within a predetermined distance such that an induced voltage may be generated in the second inductor element 760 by electromagnetic induction due to an overcurrent flowing in the first inductor element 750.

The plurality of semiconductor devices 710 may be dispersedly disposed in the first region A1 and the second region A2. The first region A1 and the second region A2 may be regions isolated from each other. For example, in the first region A1, an internal circuit for implementing an actual function of the semiconductor device 700 may be disposed. In the second region A2, an event detection circuit connected to the second inductor element 760 may be disposed.

Referring to FIG. 15, one of the plurality of semiconductor devices 710 disposed in the second region A2 may be directly connected to the second inductor element 760 through wiring patterns 721 and 723. The semiconductor device 710 directly connected to the second inductor element 760 may be a monitoring element, and may be implemented as various devices such as a field effect transistor, a bipolar junction transistor, a floating gate transistor, and a diode.

As described above, the first region A1 may be isolated from the second region A2, and the first region A1 may be selectively connected to the second region A2 when an internal circuit disposed in the first region A1 senses changes in properties of a monitoring element included in the event detection circuit and determines whether an event has occurred. A plurality of switches connecting the internal circuit to and disconnecting the internal circuit from the event detection circuit may be disposed in the first region A1. The internal circuit may turn on the plurality of switches and may supply power voltages to the event detection circuit, and may determine whether an event causing an overcurrent has occurred, and intensity of the event by receive an event detection signal.

Figure 16:
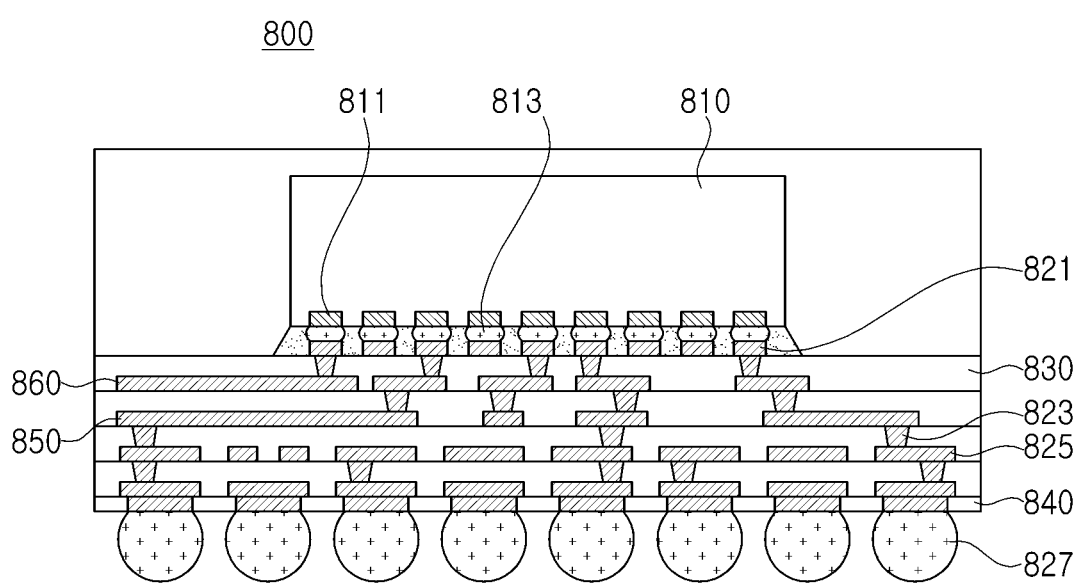
FIG. 16 is a diagram illustrating a semiconductor device according to an example embodiment of the present disclosure.

FIG. 16 is a diagram illustrating a semiconductor device according to an example embodiment.

In the examplary embodiment illustrated in FIG. 16, a semiconductor device 800 may be implemented as a semiconductor package. Referring to FIG. 16, the semiconductor device 800 may include an integrated circuit chip 810, and a package substrate 820 on which the integrated circuit chip 810 is mounted the integrated circuit chip 810 may include a plurality of pads 811 formed on one surface, and the plurality of pads 811 may be connected to a plurality of mounting pads 821 formed in a mounting region of the package substrate 820 through a plurality of micro-bumps 813.

The package substrate 820 may include a plurality of redistribution patterns 823 and 825. The plurality of redistribution patterns 823 and 825 may include a plurality of redistribution vias 823 and a plurality of redistribution layers 825, and may be dispersedly disposed on a plurality of package insulating layers 830. A plurality of bumps 827 connected to a printed circuit board may be formed on one surface of the package substrate 820. For example, the plurality of bumps 827 may be connected to a portion of redistribution layers 825 exposed on the passivation layer 840.

Referring to FIG. 16, at least a portion of the plurality of redistribution patterns 823 and 825 may provide a first inductor element 850 and a second inductor element 860. The first inductor element 850 may be connected between one of the plurality of bumps 827 and one of the plurality of micro-bumps 813. Accordingly, the first inductor element 850 may be disposed in the middle of a path through which a power voltage and/or a signal is transmitted. The micro-bump 813 connected to the first inductor element 850 may be connected to an internal circuit for implementing a function of the integrated circuit chip 810.

The second inductor element 860 may be isolated from the plurality of bumps 827 and may be connected to at least one of the plurality of micro-bumps 813. The micro-bump 813 connected to the second inductor element 860 may be disposed in the integrated circuit chip 810 and may be connected to an event detection circuit including a monitoring element. For example, the monitoring element may be directly connected to the second inductor element 860 through the micro-bump 813.

Figure 17:
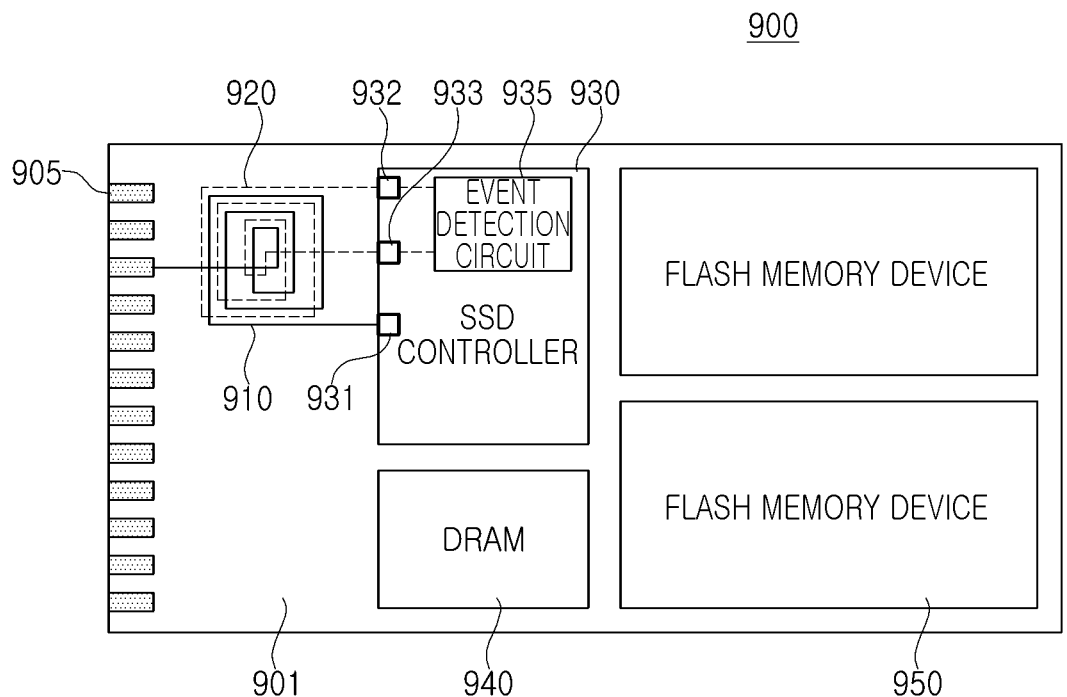
FIGS. 17 to 19 are diagrams illustrating a semiconductor device according to an example embodiment of the present disclosure.
Figure 18:
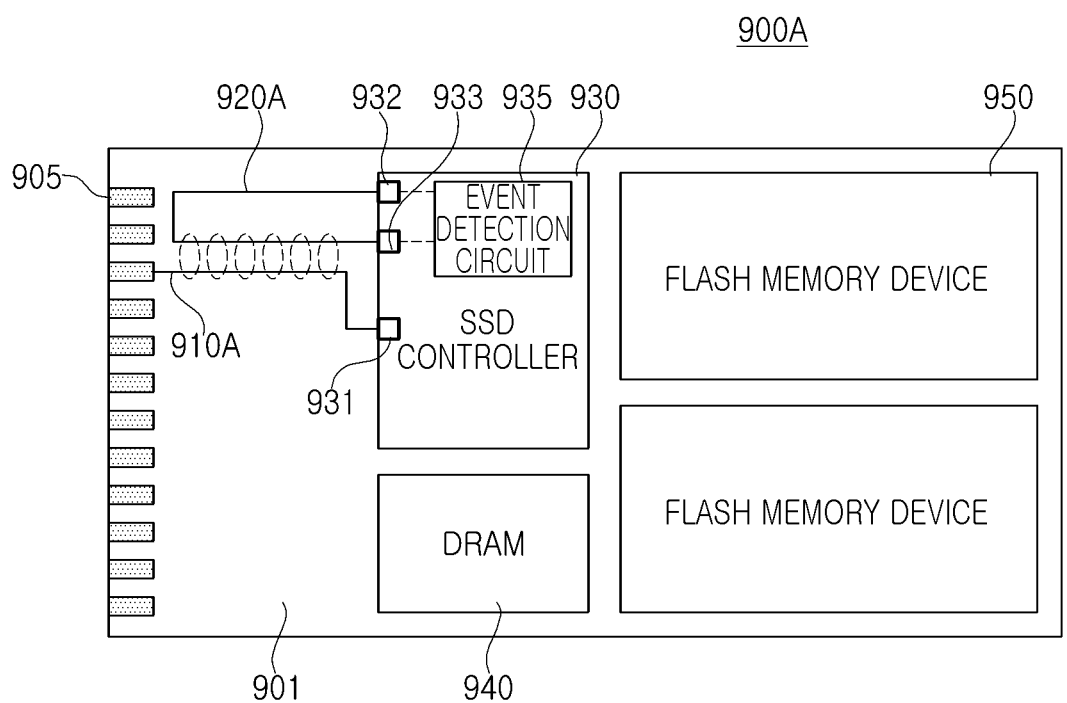
Figure 19:
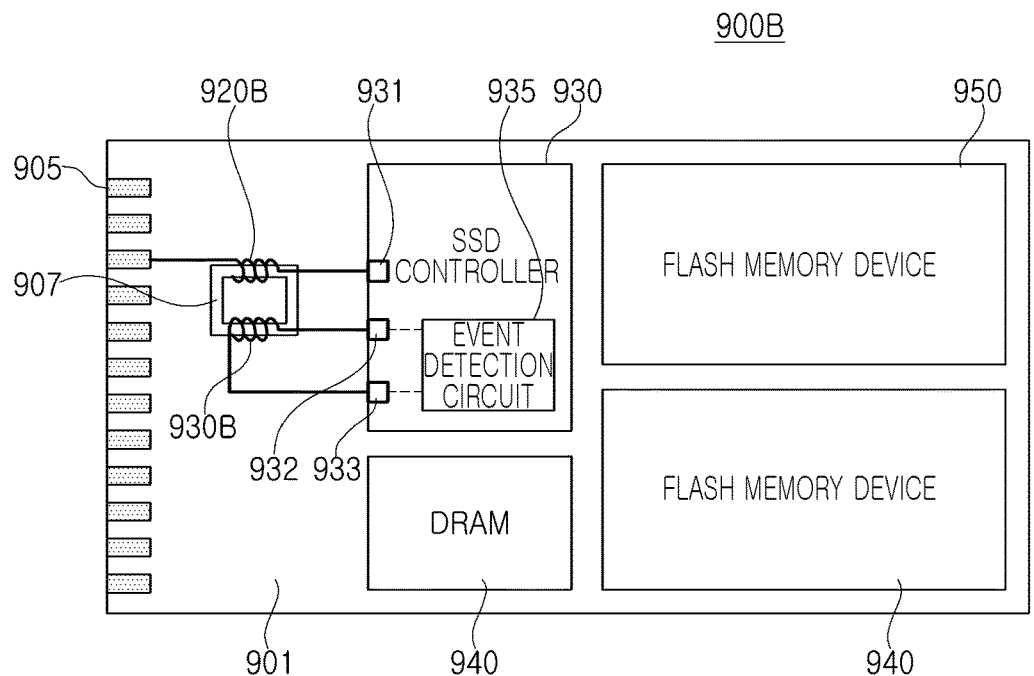

FIGS. 17 to 19 are diagrams illustrating a semiconductor device according to an example embodiment.

Referring first to FIG. 17, a semiconductor device 900 in an example embodiment may be configured as a system including a printed circuit board 901 and a plurality of semiconductor packages 930 to 950 mounted thereon. In the example embodiment illustrated in FIG. 17, the semiconductor device 900 is configured as a storage device, but an example embodiment thereof is not limited thereto.

Referring to FIG. 17, a semiconductor device 900 in an example embodiment may be a storage device, and may include a printed circuit board 901, an SSD controller 930, a DRAM 940, and a plurality of flash memory devices 950. A plurality of wiring pads 905 may be formed on one side of the printed circuit board 901, and the semiconductor device 900 may communicate with an external device via the plurality of wiring pads 905 or ma receive a power voltage from the external device.

Also, a first inductor element 910 and a second inductor element 920 may be formed on the printed circuit board 901. The first inductor element 910 and the second inductor element 920 may be provided by at least a portion of a plurality of wiring patterns formed on the printed circuit board 901. In the example embodiment illustrated in FIG. 17, each of the first inductor element 910 and the second inductor element 920 may be formed by a spiral coil. The first inductor element 910 may be connected between one of the plurality of wiring pads 905 and the first pad 931 of the SSD controller 930. Accordingly, the first inductor element 910 may be inserted into a transmission line connecting one of the plurality of wiring pads 905 to the first pad 931.

The second inductor element 920 may be disposed parallel to the first inductor element 910, and in an example embodiment, the second inductor element 920 may be disposed on a different layer on a level different from a level of the first inductor element 910. Also, the second inductor element 920 may be connected to the second pad 932 and the third pad 933 of the SSD controller 930. In other words, the second inductor element 920 may be electrically isolated from the plurality of wiring pads 905. The second pad 932 and the third pad 933 may be connected to an event detection circuit 935 disposed in the SSD controller 930.

As described above, the event detection circuit 935 may include at least one monitoring element, and the monitoring element may be directly connected to the second inductor element 920. When an overcurrent flows into the plurality of wiring pads 905 due to a transition event such as a surge or static electricity, an induced voltage may be applied to the second inductor element 920 due to apt overcurrent flowing in the first inductor element 910. The induced voltage and/or the induced current therefrom may damage a gate insulating layer included in the monitoring element, and accordingly, properties of the monitoring element may change. When the semiconductor device 900 receives power and starts operating, the SSD controller 930 may detect an event detection signal corresponding to changes in properties of the monitoring element using the event detection circuit 935 and may determine whether an event causing an overcurrent has occurred and/or intensity of the event therefrom.

Referring to FIG. 18, a semiconductor device 900A in an example embodiment may be configured as a system including a primed circuit board 901 and a plurality of semiconductor packages 930 to 950 mounted thereon. In the example embodiment illustrated in FIG. 18, the first inductor element 910A and the second inductor element 920A may be formed with patterns having a linear shape. For example, the first inductor element 910A and the second inductor element 920A may be disposed on the same layer or may be disposed on different layers.

As described above with reference to FIG. 17, the first inductor element 910A may be connected between one of the plurality of wiring pads 905 and the first pad 931 of the SSD controller 930. Accordingly, the first inductor element 910A may be inserted into a transmission line connecting one of the plurality of wiring pads 905 to the first pad 931. The second inductor element 920A may be connected to the second pad 932 and the third pad 933 of the SSD controller 930, and may be electrically isolated from the plurality of wiring pads 905. The second pad 932 and the third pad 933 may be connected to an event detection circuit 935 in the SSD controller 930.

The event detection circuit 935 may include at least one monitoring element, and the monitoring element may be directly connected to the second inductor element 920A. When an overcurrent flows into the plurality of wiring pads 905, an induced voltage may be applied to the second inductor element 920A due to an overcurrent flowing in the first inductor element 910A, and the induced voltage and/or the induced current may damage a gate insulating layer included in the monitoring element. When the semiconductor device 900 receives power and starts operating, the SSD controller 930 may detect changes in properties of the monitoring element caused by damages to the monitoring element using the event detection circuit 935, and may determine whether an event causing an overcurrent and/or intensity of the event therefrom.

Referring to FIG. 19, a semiconductor device 900B in an example embodiment may be configured as a system including a printed circuit board 901 and a plurality of semiconductor packages 930 to 950 mounted thereon. In the example embodiment illustrated in FIG. 18, the first inductor element 910B and the second inductor element 920B may form a transformer sharing a single core 907. For example, the first inductor element 910B may be provided by a primary-side coil of the transformer, and the second inductor element 920B may be provided by a secondary-side coil of the transformer.

The primary-side coil providing the first inductor element 910B may be connected between one of the plurality of wiring pads 905 and the first pad 931 of the SSD controller 930. Accordingly, the first inductor element 910A may be inserted into a transmission line connecting one of the plurality of wiring pads 905 to the first pad 931. The secondary-side coil providing the second inductor element 920B may be connected to the second pad 932 and the third pad 933 of the SSD controller 930, and may be electrically isolated from the plurality of wiring pads 905.

The second pad 932 and the third pad 933 may be connected to the event detection circuit 935 in the SSD controller 930. The event detection circuit 935 may include at least one monitoring element, and the monitoring element may be directly connected to the second inductor element 920B. When an overcurrent flows in the primary-side coil providing the first inductor element 910B, an induced voltage generated by electromagnetic induction may be applied to the second inductor element 920B.

In an example embodiment, the event causing an overcurrent may be written using damages applied to the monitoring element directly connected to the second inductor element 920B by the induced voltage and/or the induced current. As described above, the monitoring element may be implemented as at least one of various devices which may be damaged by an induced voltage and/or an induced current. When the semiconductor device 900 receives power and starts operating, the SSD controller 930 may detect changes in properties due to damages to the monitoring element using the event detection circuit 935, and may determine whether an event causing an overcurrent and/or intensity of the event therefrom.

In the example embodiments described with reference to FIGS. 17 to 19, the inductor elements 910, 910A, 910B, 920, 920A, and 920B may be connected between one of the plurality of wiring pads 905 and the SSD controller 930, but an example embodiment thereof is not limited thereto. For example, the inductor elements 910, 910A, 910B, 920, 920A, and 920B may be connected between one of the plurality of wiring pads 905, and the DRAM 940 and the flash memory device 950. Also, the inductor elements 910, 910A, 910B, 920, 920A, and 920B may be connected between at least a portion of the SSD controller 930, the DRAM 940, and the flash memory device 950. In this case, at least one of the DRAM 940 and the flash memory device 950 may include an event detection circuit.

Differently from the example embodiments described with reference to FIGS. 17 to 19, the first inductor element and the second inductor element may be included in the SSD controller 930, the DRAM 940, and the flash memory device 950. In this case, the inductor elements 910, 910A, 910B, 920, 920A, and 920B may not be disposed on the printed circuit board 901. For example, when the first inductor element and the second inductor element are included in the SSD controller 930, the first inductor element and the second inductor element may be implemented according to one of the example embodiments described with reference to FIGS. 15 and 16. In other words, the first inductor element and the second inductor element may be formed in the BEOL layer of the integrated circuit chip included in the SSD controller 930 or may be included in the SSD controller 930, and may be formed in a package substrate on which the integrated circuit chip is mounted.

As described above, even when the first inductor element and the second inductor element are included in the SSD controller 930, the first inductor element may be connected between one of the plurality of wiring pads 905 and an internal circuit of an integrated circuit chip included in the SSD controller 930. Also, the second inductor element may not be directly connected to the plurality of wiring pads 905 and may be isolated from the plurality of wiring pads 905, and may be connected to an event detection circuit of an integrated circuit chip included in the SSD controller 930.

Figure 20:
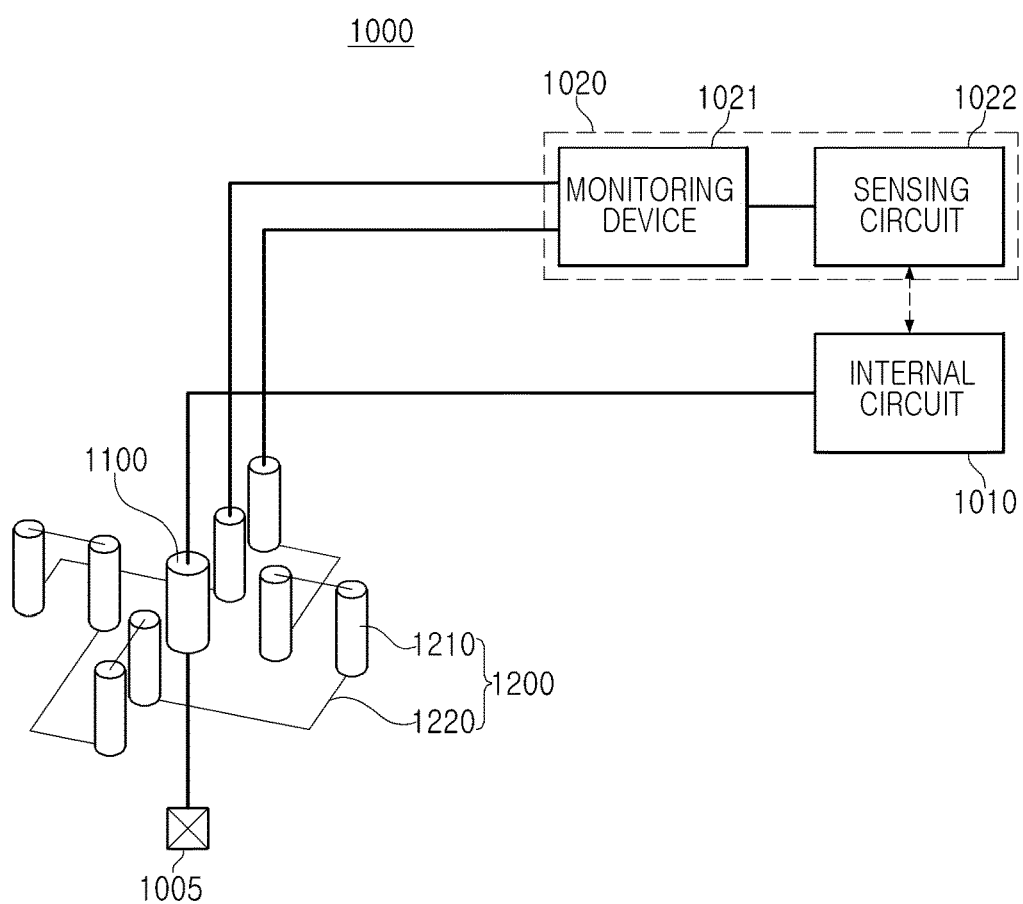
FIG. 20 is a diagram illustrating a semiconductor device according to an example embodiment of the present disclosure.

FIG. 20 is a diagram illustrating a semiconductor device according to an example embodiment.

Referring to FIG. 20, in a semiconductor device 1000 in an example embodiment, a first inductor element 1100 and a second inductor element 1200 may be implemented in the form of a Rogowski coil. The first inductor element 1100 may be connected between a pad 1005 and an internal circuit 1010 and may be inserted into a path through which a signal or a power voltage is transmitted. The first inductor element 1100 may be implemented as a via, or a through silicon via (TSV) formed in at least one of BEOL layer of an integrated circuit chip, a package substrate, and a printed circuit board.

The second inductor element 1200 may include vias 1210 extending between at least two layers and wirings 1220 disposed on the at least two layers. The wirings 1220 may be connected to each other through vias 1210 and may form a coil, and the vias 1210 and the wirings 1220 may be disposed around the first inductor element 1100. In the example embodiment illustrated in FIG. 20, the vias 1210 may be disposed in four directions with respect to the first inductor element 1100, but the number of the vias 1210 and the arrangement form thereof may be varied.

For example, the semiconductor device 1000 according to the example embodiment illustrated in FIG. 20 may be configured as one of a plurality of integrated circuit chips configured to be stacked. For example, the semiconductor device 1000 may be implemented as a high bandwidth memory (HBM). The plurality of integrated circuit chips may be connected to each other by through-silicon vias penetrating at least a portion of the plurality of integrated circuit chips.

The first inductor element 1100 may be provided by at least one of through-silicon vias connecting a plurality of integrated circuit chips to each other. A second inductor element 1200 including vitas 1210 and wirings 1220 may be disposed around the through-silicon via providing the first inductor element 1100 as in the example embodiment illustrated in FIG. 20.

In an example embodiment, the semiconductor device 1000 may include an internal circuit 1010 connected to the first inductor element 1100, and an event detection circuit 1020 connected to the second inductor element 1200. Differently from the first inductor element 1100 connected between the pad 1005 and the internal circuit 1010, the second inductor element 1200 may be connected only to the event detection circuit 1020. Referring to FIG. 20, the second inductor element 1200 is connected to the sensing circuit 1022 through the monitoring element 1021.

An operation of the semiconductor device 1000 may be similar to the other example embodiments described above. An overcurrent generated due to various events may flow into the semiconductor device 1000 through the pad 1005, and an ESD protective circuit for blocking an overcurrent may be connected between the internal circuit 1010 and the pad 1005. However, separately from protecting the internal circuit 1010 by blocking an overcurrent, it may be necessary to write the event causing an overcurrent and to manage risk factors in production manufacturing, and transportation lines, and in an example embodiment, an event generating an overcurrent may be written using the second inductor element 1200 and the monitoring element 1021. For example, an event which may generate an overcurrent may include human body model (HBM), human metal model (HMM), charged-device model (CBE), charged board event (CBE), cable discharge event (CDE), surge, static electricity, and burst.

When an overcurrent flows into the pad 1005 due to the above-described event, an induced voltage may be excited in the second inductor element 1200 due to an overcurrent flowing in the first inductor element 1100. For example, the magnitude of the induced voltage may be determined according to a ratio between inductance of the first inductor element 1100 and inductance of the second inductor element 1200.

Due to the induced voltage applied to the second inductor element 1200, the monitoring element 1021 may be damaged. For example, when the monitoring element 1021 is configured as a transistor, the gate insulating layer inserted between the body of the transistor and the gate electrode may be damaged by an induced voltage, which may lead to changes in properties of the monitoring element 1021. Accordingly, the event generating an overcurrent may be written in the event detection circuit 1020 by changing properties of the monitoring element 1021 by allowing the monitoring element 1021 to be damaged.

When the semiconductor device 1000 starts operating, the internal circuit 1010 may supply a power voltage to the sensing circuit 1022 and may receive an event detection signal from the sensing circuit 1022. The sensing circuit 1022 may output event detection signals having different values according to properties of the monitoring element 1021. In an example embodiment, the sensing circuit 1022 may output event detection signals having different values according to the degree of damage to the monitoring element according to intensity of the induced voltage and/or the induced current. In this case, the internal circuit 1010 may determine whether an event has occurred and also intensity of the event based on the event detection signal.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
an internal circuit connected to at least one pad;
a first inductor element connected between the at least one pad and the internal circuit;
a second inductor element inductively coupled to the first inductor element, and configured to generate an induced voltage due to an overcurrent flowing in the first inductor element; and
an event detection circuit including a monitoring element connected to the second inductor element, and configured to generate an event detection signal by sensing changes in properties of the monitoring element caused by permanent damage caused by the induced voltage across the second inductor element.

2. The semiconductor device of claim 1, wherein the internal circuit supplies an operating voltage to the event detection circuit, and identifies that an event causing the overcurrent has occurred based on a the event detection signal being received from the event detection circuit.

3. The semiconductor device of claim 1, wherein the monitoring element includes at least one of a transistor and a diode.

4. The semiconductor device of claim 2, wherein the monitoring element includes a transistor, and
wherein the event detection circuit generates the event detection signal by sensing at least one of a drain voltage and/or a gate voltage of the transistor.

5. The semiconductor device of claim 4, further configured to increase a drain voltage of the transistor in the monitoring element when the overcurrent flows in the first inductor element by the event.

6. The semiconductor device of claim 4, further configured to decrease a gate voltage of the transistor in the monitoring element when the overcurrent flows in the first inductor element by the event.

7. The semiconductor device of claim 2, wherein the event detection circuit further includes a reference element including an element that is the same as the monitoring element, and an operational amplifier having a first input terminal connected to the monitoring element and a second input terminal connected to the reference element.

8. The semiconductor device of claim 7, wherein the internal circuit determines whether the event has occurred based on an output of the operational amplifier, and the internal circuit determines an intensity of the event based on an output of the operational amplifier.

9. The semiconductor device of claim 1, wherein, the at least one pad connected to the first inductor element is configured to receive a power voltage.

10. The semiconductor device of claim 1, wherein the at least one pad connected to the first inductor element is configured to receive a signal different from a power voltage.

11. A semiconductor device, comprising:
a semiconductor package including at least one internal circuit and an event detection circuit configured to detect an event generating an overcurrent flowing into the at least one internal circuit; and
a printed circuit board having a mounting region on which the semiconductor package is mounted, and including a plurality of wiring patterns electrically connected to the semiconductor package and a plurality of wiring pads connected to the plurality of wiring patterns,
wherein the semiconductor device further includes a first inductor element connected between at least one of the plurality of wiring pads and the internal circuit, and a second inductor element coupled to the first inductor element and connected to the event detection circuit, and
wherein the event detection circuit includes a monitoring element of which properties change caused by permanent damage by electromagnetic induction of the second inductor element coupled to the first inductor element, and wherein the event detection circuit is further configured to detect changes in properties of the monitoring element and to output an event detection signal to the internal circuit.

12. The semiconductor device of claim 11, where the electromagnetic induction includes at least one of an induced voltage or an induced current through which the properties of the monitoring element are changed, and
wherein the semiconductor package includes an integrated circuit chip, and the internal circuit and the event detection circuit are included in the integrated circuit chip.

13. The semiconductor device of claim 12, wherein the first inductor element and the second inductor element are included in the integrated circuit chip.

14. The semiconductor device of claim 13,
wherein the semiconductor package comprises a package substrate including the integrated circuit chip mounted thereon, and a plurality of redistribution patterns connected to the integrated circuit chip, and
wherein the first inductor element is connected to at least one of the plurality of redistribution patterns, and the second inductor element is electrically isolated from the plurality of redistribution patterns.

15. The semiconductor device of claim 11,
wherein the semiconductor package includes an integrated circuit chip, and a package substrate including the integrated circuit chip mounted thereon and having a plurality of redistribution patterns connected to the integrated circuit chip, and
wherein the first inductor element and the second inductor element are provided by at least a portion of the plurality of redistribution patterns.

16. The semiconductor device of claim 11,
wherein the first inductor element and the second inductor element are provided by the plurality of wiring patterns, and
wherein the first inductor element is connected to at least one of the plurality of wiring pads, and the second inductor element is electrically isolated from the plurality of wiring pads.

17. The semiconductor device of claim 11,
wherein each of the first inductor element and the second inductor element includes a coil, and
wherein the number of turns of the coil included in the first inductor element is different from the number of turns of the coil included in the second inductor element.

18. The semiconductor device of claim 11, wherein the first inductor element includes a first line extending in one direction, and the second inductor element includes a second line extending in the one direction and isolated from the first inductor element by a predetermined distance.

19. A semiconductor device, comprising:
an internal circuit connected to a power pad receiving a power voltage and a signal pad inputting and outputting a signal;
a first inductor element connected between at least one of the power pad and the signal pad, and the internal circuit;
a second inductor element disposed adjacent to the first inductor element; and
a monitoring element connected to the second inductor element,
wherein the internal circuit identifies whether an inflow of an overcurrent flowing from the at least one of the power pad and the signal pad to the first inductor element has occurred by detecting a voltage determined according to properties of the monitoring element changed by permanent damage.

20. The semiconductor device of claim 19, wherein the second inductor element and the monitoring element are electrically isolated from the internal circuit subsequent to the internal circuit identifying that an inflow of the overcurrent has occurred.

* * * * *